United States Patent
Fan et al.

(10) Patent No.: US 6,486,054 B1
(45) Date of Patent: Nov. 26, 2002

(54) METHOD TO ACHIEVE ROBUST SOLDER BUMP HEIGHT

(75) Inventors: Yang-Tung Fan, Jubei; Hsiu-Mei Yu, Hsin-Chu; Li-Hsin Tseng, Taichung; Kuang-Peng Lin, Hsin-Chu; Ta-Yang Lin, Changhua, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/058,472

(22) Filed: Jan. 28, 2002

(51) Int. Cl.[7] .............................................. H01L 21/44
(52) U.S. Cl. ..................... 438/613; 438/614; 438/615; 438/660; 438/666; 438/669; 438/678; 438/679
(58) Field of Search ................................. 438/613, 614, 438/615, 660, 666, 669, 678, 679

(56) References Cited

U.S. PATENT DOCUMENTS

| 5,130,275 | A | * | 7/1992 | Dion | 437/225 |
| 5,277,756 | A | * | 1/1994 | Dion | 156/664 |
| 5,418,186 | A | * | 5/1995 | Park et al. | 437/183 |
| 5,616,517 | A | * | 4/1997 | Wen et al. | 438/613 |
| 5,665,639 | A | * | 9/1997 | Seppala et al. | 438/614 |
| 5,946,590 | A | * | 8/1999 | Satoh | 438/613 |
| 6,077,765 | A | * | 6/2000 | Naya | 438/614 |
| 6,130,149 | A | * | 10/2000 | Chien et al. | 438/613 |
| 6,218,281 | B1 | * | 4/2001 | Watanabe et al. | 438/612 |
| 6,228,681 | B1 | * | 5/2001 | Gilleo et al. | 438/613 |
| 6,372,622 | B1 | * | 4/2002 | Tan et al. | 438/612 |
| 6,376,354 | B1 | * | 4/2002 | Yih | 438/613 |
| 6,387,795 | B1 | * | 5/2002 | Shao | 438/613 |

* cited by examiner

Primary Examiner—Richard Booth
Assistant Examiner—Lynne A. Gurley
(74) Attorney, Agent, or Firm—George O. Saile; Stephen B Ackerman

(57) ABSTRACT

The present invention teaches how greater solder ball height can be achieved without the need to sacrifice areal density. The mold in which the solder is formed, is created in two steps. In a first exposure, a negative photoresist (preferably DFR) is patterned to form a conventional cylindrical mold. However, exposure and development time are adjusted in such a way that a layer of unexposed and undeveloped resist of reduced thickness remains covering the floor of the mold. This residual resist layer is given a second exposure and, after development, forms an annular insert in the bottom of the first mold. After the mold has been filled with solder (either through electroplating or by using solder paste) it is removed, the result being a solder bump made up of two contiguous coaxial cylinders the upper one having the larger diameter. After remelt, bumps having this shape form oblate spheroids rather than spheres.

26 Claims, 4 Drawing Sheets

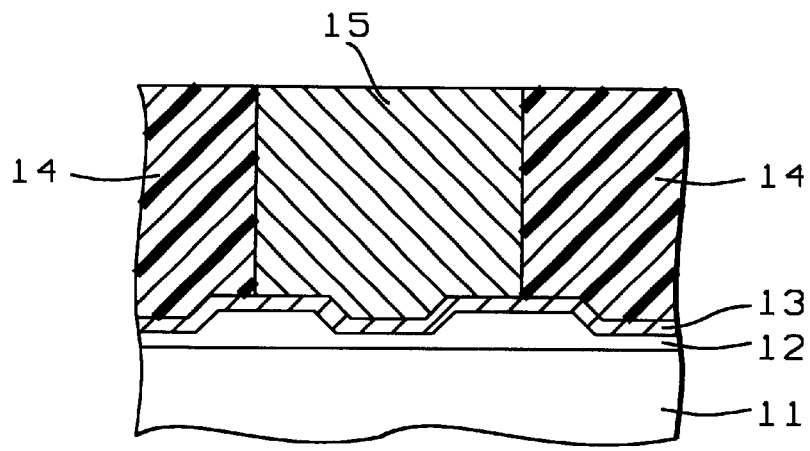
FIG. 1 – Prior Art
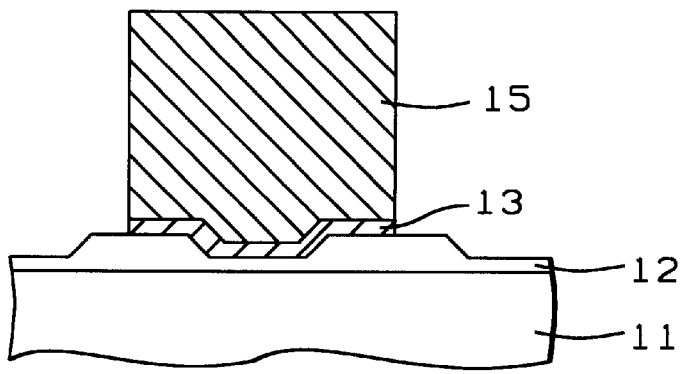
FIG. 2 – Prior Art
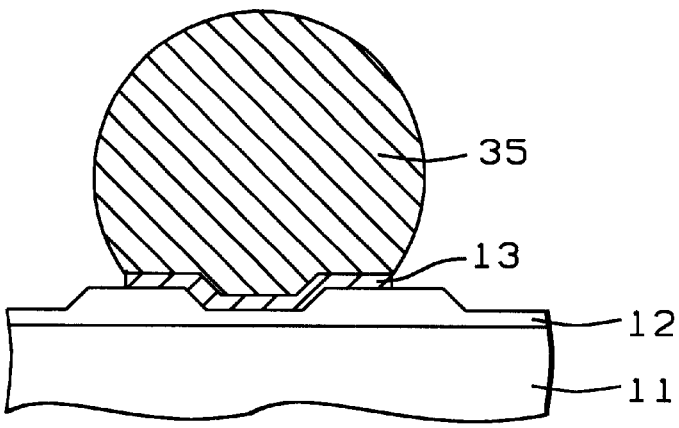
FIG. 3 – Prior Art

METHOD TO ACHIEVE ROBUST SOLDER BUMP HEIGHT

FIELD OF THE INVENTION

The invention relates to the general field of semiconductor integrated circuits with particular reference to connection metallurgy.

BACKGROUND OF THE INVENTION

The flip chip approach for making chip I/O connections to the next packaging level has received widespread application. At the heart of this technology are individual solder pellets or bumps, each of which contacts a single chip I/O pad and extends upwards away from the chip surface. A common technique for forming solder bumps is to form a mold of photoresist and to then fill the mold with solder, either through electroplating or by application of a solder paste. This is illustrated in FIG. 1 where semiconductor wafer 11, containing completed integrated circuits, is seen to have a top layer 12 in which have been formed recesses for locating the solder bumps. Conductive vias that make contact to the underlying chip and pass through layer 12 are not explicitly shown.

Layer 13 is a layer of conductive material(s) that initially cover(s) the entire chip thereby enabling photoresist mold 14 to be filled with solder 15 that is grown therein through electroplating or as a paste. If the electroplating method is used, a layer of UBM (under ball metallurgy) made up of materials such as titanium, copper, or nickel is first grown over the surface of layer 13 (UBM not shown as a separate layer).

As an alternative to electroplating, a pad of UBM material may be formed first on the upper surface of layer 12 followed by the placement of photoresist mold 14 in alignment therewith, the mold being then filled with a solder paste of lead-tin, silver-tin, or silver-copper-tin, etc. through printing or plating. Whichever process is used, the net result after the photoresist mold has been removed, is solder bump 15 that sits on pad 12. The latter may be a single UBM layer or a UBM layer over a seed layer. This is illustrated in FIG. 2.

Part of the standard process for forming solder bumps is a remelt step where the bumps are gently heated to ensure their adhesion to the underlying UBM pads. As a result of this, the bumps assume a spherical shape (due to surface tension forces) and each solder bump becomes a solder ball 35, as illustrated in FIG. 3. This means that for every increase in solder bump height there will be a corresponding increase in solder bump width. Because of this the mean spacing between solder bumps has, in the prior art, been limited to greater than about 150 microns.

The present invention teaches a method to overcome this limitation.

A routine search of the prior art was performed with the following references of interest being found:

In U.S. Pat. No. 6,130,149, Chien et al. discuss the bump process in their Background of the invention section. Seppala et al. disclose a single exposure DFR and bump process in U.S. Pat. No. 5,665,639. A two step bump process is described in U.S. Pat. No. 6,228,681 (Gilleo), but it is different from that of the present invention. U.S. Pat. No. 6,218,281 (Watanabe) and U.S. Pat. No. 6,077,765 (Naya) are related bump processes.

SUMMARY OF THE INVENTION

It has been an object of at least one embodiment of the present invention to provide a process for forming solder bumps for use in a flip chip.

Another object of at least one embodiment of the present invention has been that, after remelt, the resulting solder balls have an elongated shape whereby a high area density of bumps can be achieved without sacrificing solder ball height.

Still another object of at least one embodiment of the present invention has been that said process be fully compatible with current methods for forming solder bumps.

These objects have been achieved by preparing the mold in which the solder is formed in two steps. In a first exposure, photoresist is patterned to form a conventional cylindrical mold. However, exposure and development are adjusted in such a way that a layer of unexposed and undeveloped resist remains covering the floor of the mold. This residual resist layer is given a second exposure and, after development, forms an annular insert in the bottom of the first mold. After the mold has been filled with solder (either through electroplating or by using solder paste) it is removed, the result being a solder bump made up of two contiguous coaxial cylinders the upper one having the larger diameter. After remelt, bumps having this shape form oblate spheroids, rather than spheres, so that greater ball height is achieved without the need to sacrifice areal density.

BRIEF DESCRIPTION OF THE DRAWINGS

FIGS. 1–3 show the prior art process used to prepare solder balls.

DESCRIPTION OF THE PREFERRED EMBODIMENTS

Figure 4:
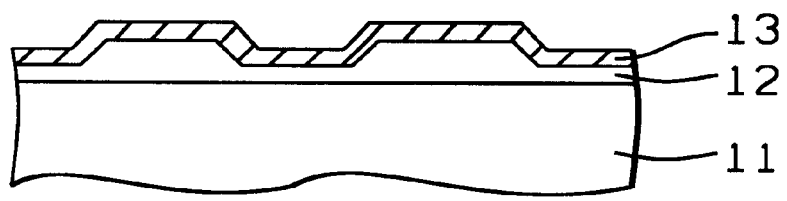
FIG. 4 illustrates the starting point for implementation of the process of the present invention.

Referring now to FIG. 4, the process begins with the provision of semiconductor wafer 11 having an upper layer 12, suitably shaped for holding solder bumps. In a first embodiment of the invention, seed layer 13 is first deposited and then sputter cleaned. The seed layer could be any suitable metal such as titanium, copper, etc. Its thickness is between about 0.05 and 0.6 microns.

Figure 5:
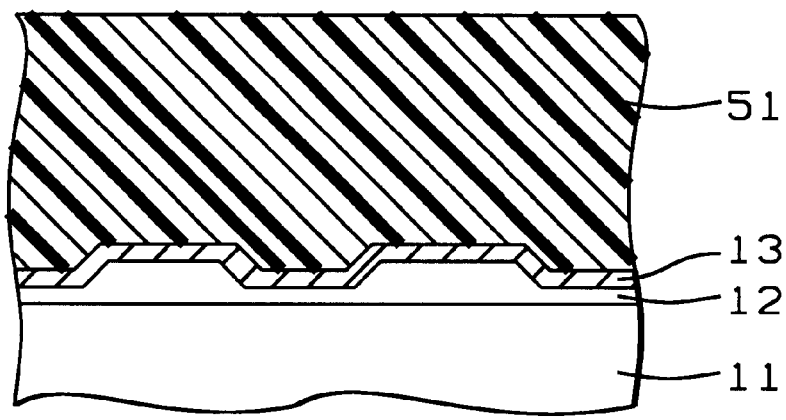
FIG. 5 shows the placement of photoresist of the desired thickness.

Then negative photoresist layer 51, as seen in FIG. 5, is applied to the surface of layer 13. Photoresist layer 51 has a thickness between about 80 and 120 microns. We have preferred to use DFR (dry film resist) for layer 51 because larger bump heights can be achieved but, in principle, any type of negative photoresist could have been used without departing from the spirit of the invention.

Figure 6:
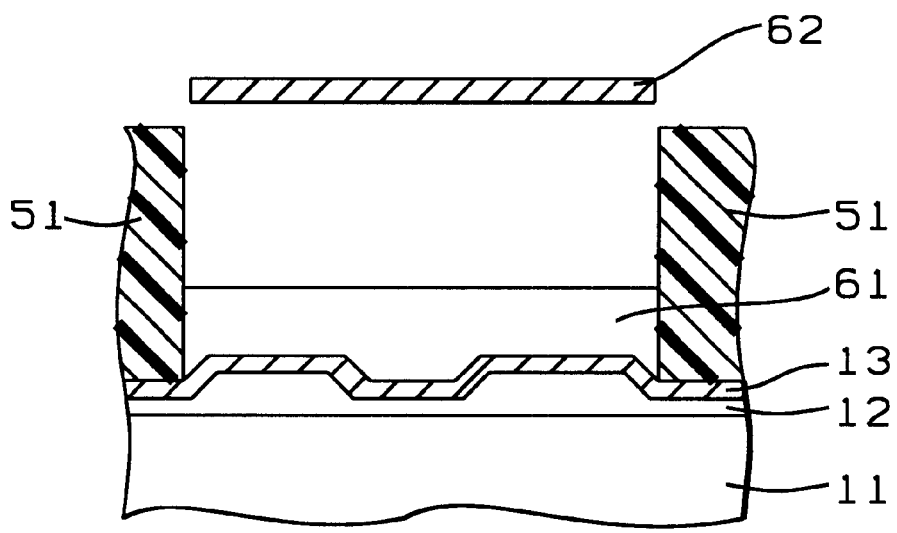
FIG. 6 illustrates a key step wherein a portion of the resist is exposed and developed while another portion, that is unexposed, remains after development at a reduced thickness.

Referring now to FIG. 6, photoresist layer 51 is now exposed to suitable actinic radiation in the form of an image originating at reticle 62, said image serving to define the pattern for the outer portion 51 of the mold. The inside diameter of mold 51 is between about 80 and 150 microns.

Next, as a key feature of the invention, the photoresist is developed in such a manner that, in addition to fully developed and exposed portion 51, additional, unexposed, photoresist 61 is left that covers the inside floor of the mold. The thickness of layer 61 is between about 50 and 60 microns. The step of leaving some unexposed photoresist behind after development is accomplished by carefully controlling the development time. We note that although the process of the present invention will work with any negative photoresist, DFR takes longer to develop than other types of negative photoresist, thereby making control of development time easier.

Figure 7:
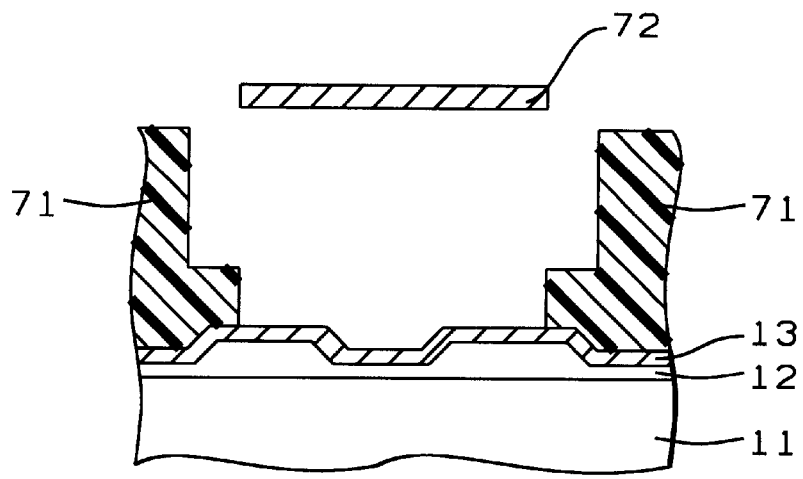
FIG. 7 shows the formation of the mold.

This is followed by a second exposure, of an image originating at reticle 72, whereby an annular portion of layer 61, that abuts layer 51, is formed, resulting, after development, in mold 71, as illustrated in FIG. 7. The inside diameter of the lower portion of mold 71 is between about 20 and 30 microns less than that of mold 51 so that it falls in the range of from 60 to 120 microns.

Figure 8:
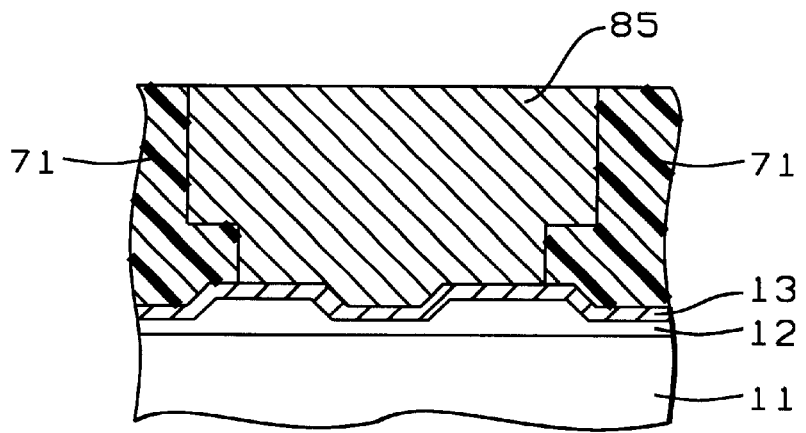
FIG. 8 shows the mold filled with solder.

Layer 13 is then thickened by growing on it a UBM layer (not separately shown) between about 2 and 9 microns thick, using electroplating. Suitable material for the UBM layer include copper and nickel. This is followed by the growing of solder layer 85, also by electroplating, as shown in FIG. 8. Build-up of 85 is continued until mold 71 has been filled with solder.

Figure 9:
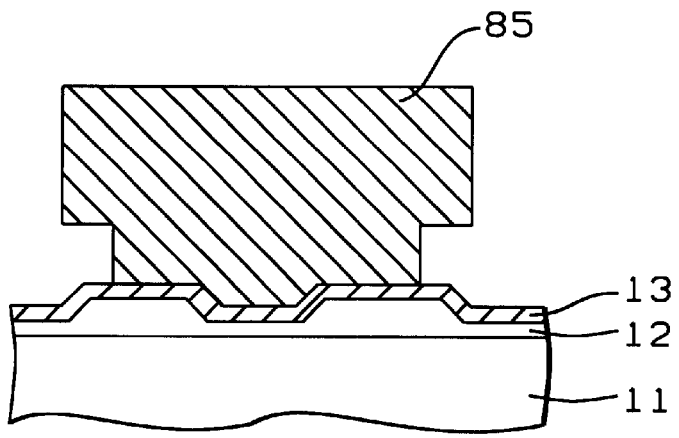
FIG. 9 shows the solder bump after removal of the mold.

All photoresist is then removed, as illustrated in FIG. 9, so that solder bump 85 emerges. Solder bump 85 has the form of two contiguous coaxial cylinders, one above the other, with the upper cylinder having a larger diameter than the lower cylinder.

Figure 10:
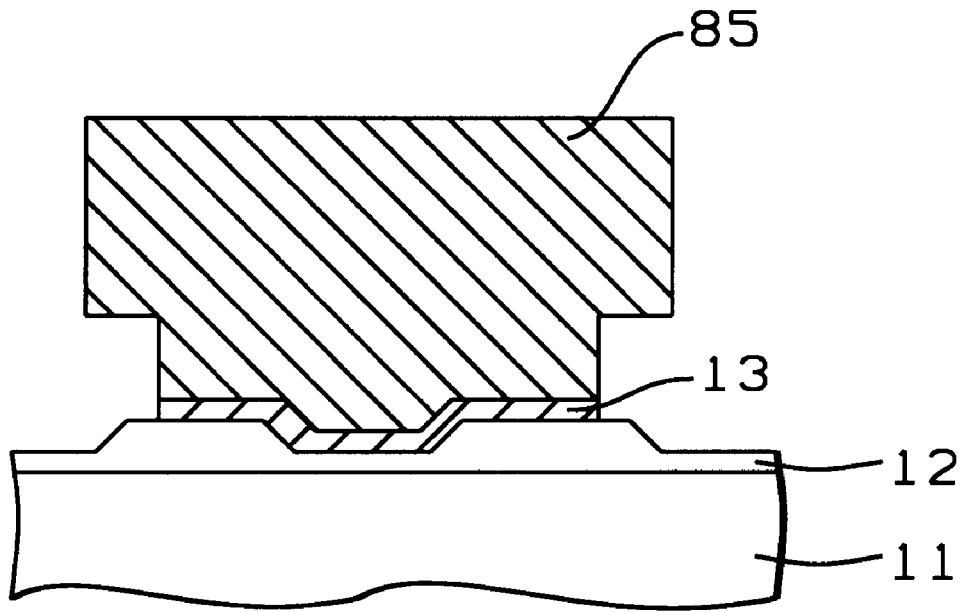
FIG. 10 shows FIG. 9 after removal of all exposed UBM material.
Figure 11:
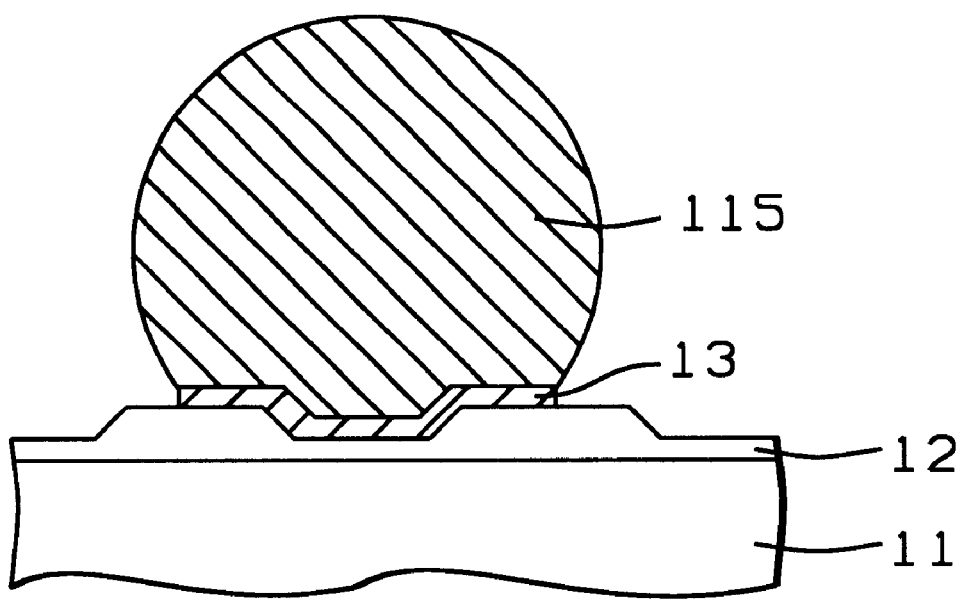
FIG. 11 shows how, after remelt, the solder ball has an elongated shape.

The process concludes with the removal of all exposed portions of layer 13, as shown in FIG. 10, following which the structure is subjected to a standard remelt procedure (heating to a peak temperature between about 200 and 360° C. for between about 6 and 10 minutes). Because of its narrow bottom design, bump 85 achieves the shape of an oblate spheroid 115, as shown in FIG. 11, whose long axis extends vertically upwards from layer 13. Using the guidelines disclosed above, we have been able to achieve solder bumps whose height (vertical diameter), after remelt, exceeded their horizontal diameter by between about 15 and 30 microns. Such solder bumps typically have a height of between about 80 and 140 microns.

A second embodiment of the present invention is similar to the first embodiment described above except that mold 71 is filled with a solder paste rather than by electroplating. As a consequence a seed layer is not required. However, a UBM pad must first be formed by depositing and then suitably patterning the UBM layer, with the mold 71 being located directly over this pad (equivalent to layer 13 in FIG. 10). The step of filling the mold with a solder paste is accomplished through printing. Also, an additional heating step (heating to a peak temperature between about 200 and 360° C. for between about 6 and 10 minutes) needs to be introduced to remove all binding materials from the solder paste.

What is claimed is:

1. A process for solder bump formation, comprising:
   on an upper surface of a semiconductor wafer, depositing, and then sputter cleaning, a seed layer;
   applying a layer of negative photoresist, having a first thickness, on said seed layer and then exposing said layer of photoresist through a first pattern that defines a first mold having a first inside diameter and a floor;
   developing said layer of photoresist in such a manner as to form said first mold while leaving a layer of unexposed photoresist, having a second thickness that is less than said first thickness, fully covering said floor;
   then exposing said layer of unexposed photoresist through a second pattern that defines a second mold located inside said first mold and having a second inside diameter that is less than said first inside diameter;
   then fully developing all photoresist, thereby forming a final mold;
   by means of electroplating, growing a layer of UBM and then a layer of solder inside said final mold until said final mold is filled with solder;
   removing all photoresist, thereby forming a solder bump having the form of a cylinder, having said first diameter, coaxially disposed above a cylinder having said second diameter;
   then removing all exposed UBM; and
   heating said wafer whereby said solder bump assumes the shape of an oblate spheroid whose long axis extends vertically upwards from said upper surface.

2. The process described in claim 1 wherein the step of developing said layer of negative photoresist in such a manner as to form said first mold while leaving a layer of unexposed photoresist fully covering said floor is achieved through control of development time.

3. The process described in claim 1 wherein said first photoresist thickness is between about 80 and 120 microns.

4. The process described in claim 1 wherein said second photoresist thickness is between about 50 and 60 microns.

5. The process described in claim 1 wherein said first inside diameter is between about 80 and 140 microns.

6. The process described in claim 1 wherein said second inside diameter is between about 60 and 120 microns.

7. The process described in claim 1 wherein the step of heating said wafer whereby said solder bump assumes the shape of an oblate spheroid further comprises heating to a peak temperature between about 200 and 360° C. for between about 6 and 10 minutes.

8. The process described in claim 1 wherein said oblate spheroid has a vertical diameter that exceeds its horizontal diameter by between about 15 and 30 microns.

9. The process described in claim 1 wherein said oblate spheroid solder bumps have a bump height of between about 80 and 140 microns.

10. The process described in claim 1 wherein said seed layer is selected from the group consisting of titanium and copper.

11. The process described in claim 1 wherein said seed layer is deposited to a thickness between about 0.05 and 0.6 microns.

12. The process described in claim 1 wherein said UBM layer is selected from the group consisting of titanium, copper and nickel.

13. The process described in claim 1 wherein said UBM layer is deposited to a thickness between about 2 and 9 microns.

14. A process for solder bump formation, comprising:
   sputter cleaning an upper surface of a semiconductor wafer and then depositing thereon a UBM layer;
   patterning said UBM layer to form a UBM pad;
   applying a layer of negative photoresist, having a first thickness, and then exposing said layer of photoresist through a first pattern that defines a first mold having a first inside diameter and a floor that comprises said UBM pad;
   developing said layer of photoresist in such a manner as to form said first mold while leaving a layer of unexposed photoresist, having a second thickness that is less than said first thickness, fully covering said floor;

then exposing said layer of unexposed photoresist through a second pattern that defines a second mold located inside said first mold and having a second inside diameter that is less than said first inside diameter;

then fully developing all photoresist, thereby forming a final mold;

filling said final mold with a solder paste;

removing all photoresist, thereby forming a solder bump having the form of a cylinder, having said first diameter, coaxially disposed above a cylinder having said second diameter;

then removing all exposed UBM; and heating said wafer whereby said solder bump assumes the shape of an oblate spheroid whose long axis extends vertically upwards from said upper surface.

15. The process described in claim 14 wherein the step of developing said layer of negative photoresist in such a manner as to form said first mold while leaving a layer of unexposed photoresist fully covering said floor is achieved through control of development time.

16. The process described in claim 14 wherein said first photoresist thickness is between about 80 and 120 microns.

17. The process described in claim 14 wherein said second photoresist thickness is between about 50 and 60 microns.

18. The process described in claim 14 wherein said first inside diameter is between about 80 and 150 microns.

19. The process described in claim 14 wherein said second inside diameter is between about 60 and 120 microns.

20. The process described in claim 14 wherein the step of heating said wafer whereby said solder bump assumes the shape of an oblate spheroid further comprises heating to a peak temperature between about 200 and 360° C. for between about 6 and 10 minutes.

21. The process described in claim 14 wherein said oblate spheroid has a vertical diameter that exceeds its horizontal diameter by between about 15 and 30 microns.

22. The process described in claim 14 wherein said oblate spheroid solder bumps have a bump height of between about 80 and 140 microns.

23. The process described in claim 14 wherein said UBM layer is selected from the group consisting of titanium, copper and nickel.

24. The process described in claim 14 wherein said UBM layer is deposited to a thickness between about 2 and 9 microns.

25. The process described in claim 14 wherein the step of filling said final mold with a solder paste is a achieved by plating or printing.

26. The process described in claim 14 wherein the step of heating said wafer to remove all binding materials from said solder paste further comprises heating to a peak temperature between about 200 and 360° C. for between about 6 and 10 minutes.

* * * * *